(12) United States Patent
Gabrielsson

(10) Patent No.: US 12,250,003 B2
(45) Date of Patent: Mar. 11, 2025

(54) ANALOG TO PULSE WIDTH MODULATION (PWM) CIRCUIT

(71) Applicant: Webasto Charging Systems, Inc., Monrovia, CA (US)

(72) Inventor: Peter Gabrielsson, Monrovia, CA (US)

(*) Notice: Subject to any disclaimer, the term of this patent is extended or adjusted under 35 U.S.C. 154(b) by 180 days.

(21) Appl. No.: 18/120,097

(22) Filed: Mar. 10, 2023

(65) Prior Publication Data
US 2024/0305311 A1    Sep. 12, 2024

(51) Int. Cl.
*H03M 1/82* (2006.01)
*G01R 19/00* (2006.01)
*G01R 19/25* (2006.01)
*G01R 35/00* (2006.01)
*H03M 13/25* (2006.01)

(52) U.S. Cl.
CPC ........ *H03M 1/822* (2013.01); *G01R 19/2503* (2013.01); *H03M 13/25* (2013.01); *G01R 19/0023* (2013.01); *G01R 35/005* (2013.01)

(58) Field of Classification Search
CPC .. H03M 1/822; H03M 13/25; G01R 19/0023; G01R 35/005; G01R 19/2503
See application file for complete search history.

(56) References Cited

U.S. PATENT DOCUMENTS

| | | | |
|---|---|---|---|
| 8,395,367 B2 * | 3/2013 | Chien | H02M 3/158 323/288 |
| 9,641,073 B2 * | 5/2017 | Mahmoudi | H02M 1/36 |
| 2007/0040608 A1 | 2/2007 | Magrath et al. | |

FOREIGN PATENT DOCUMENTS

EP    2887543 A1    6/2015

OTHER PUBLICATIONS

International Search Report and Written Opinion for PCT/US2024/018925 mailed Jun. 11, 2024.

* cited by examiner

*Primary Examiner* — Khai M Nguyen
(74) *Attorney, Agent, or Firm* — Command IP LLP; Michael Zarrabian

(57) ABSTRACT

Systems, devices, and methods for a high-voltage conversion circuit system comprising: an error detection and correction module configured to receive an analog input signal and a feedback signal and generate a correction signal; and an analog to pulse width modulation (PWM) module configured to receive the analog input signal and correction signal and generate a PWM output signal; where the generated PWM output signal is fed back to the error detection and correction module as said feedback signal.

20 Claims, 11 Drawing Sheets

ANALOG TO PULSE WIDTH MODULATION (PWM) CIRCUIT

TECHNICAL FIELD

Embodiments relate generally to a voltage measurement device, and more particularly to a circuit which converts an input voltage to a pulse width modulation (PWM) signal for measuring.

BACKGROUND

Voltage measurement is a critical tool and method used throughout many industries to utilize a voltage efficiently and accurately. Knowing and understanding an available voltage is critical in how the voltage is used and in protecting connected electronics and equipment. Voltage measurement in high voltage environments may require additional protective measures such as maintaining a galvanic isolation between a high voltage and a measurement circuit to prevent issues such as dangers to humans and equipment damage. These high voltage environments create hurdles in measuring voltage which makes measurement devices expensive, inaccurate, or both.

SUMMARY

A system embodiment may include: an error detection and correction module configured to receive an analog input signal and a feedback signal and generate a correction signal; and an analog to pulse width modulation (PWM) module configured to receive the analog input signal and the correction signal and generate a PWM output signal; where the generated PWM output signal is fed back to the error detection and correction module as said feedback signal.

In additional system embodiments, the error detection and correction module comprises a PWM to analog module. In additional system embodiments, the PWM to analog module is configured to receive the feedback signal and the analog input signal and generate an analog signal. In additional system embodiments, the error detection and correction module further comprises an error comparator module. In additional system embodiments, the error comparator module is configured to receive and compare the analog signal from the PWM to analog module with the analog input signal to generate an error correction signal proportional to the feedback signal. In additional system embodiments, the analog to PWM module comprises a low-pass filter. In additional system embodiments, the low-pass filter receives and integrates the correction signal and generates a triangle wave signal. In additional system embodiments, the analog to PWM module further comprises an output comparator.

In additional system embodiments, the output comparator receives and compares the triangle wave signal to the analog input signal and generates the PWM output signal, where the PWM output signal comprises a duty cycle proportional to the analog input signal. In additional system embodiments, the PWM to analog module further comprises a digital-to-analog converter (DAC). In additional system embodiments, the DAC receives the feedback signal and a reference signal and converts feedback signal to an analog output signal. In additional system embodiments, the PWM to analog module further comprises a low-pass (LP) filter.

In additional system embodiments, the LP filter receives the analog output signal and generates an output signal, where the output signal from the LP filter is proportionate to a duty cycle of the analog input signal. In additional system embodiments, the error detection and correction module further comprises an error comparator module, and where the error comparator module further comprises an error comparator. In additional system embodiments, the error comparator receives and compares the output signal from the LP filter to the analog input signal and generates an error correction signal, where the error correction signal has a duty cycle that is proportional to that of the feedback signal.

A method embodiment may include: receiving an analog input signal at an error detection and correction module and an analog to pulse width modulation (PWM) module; receiving a feedback signal at the error detection and correction module; generating a correction signal at the error detection and correction module based on the received analog input signal and the received feedback signal; receiving the correction signal at the analog to PWM module; generating a PWM output signal at the analog to PWM module based on the received correction signal, where the generated PWM output signal is fed back to the error detection and correction module as said feedback signal.

In additional method embodiments, generating the PWM output signal further comprises: comparing the analog input signal to a triangle wave signal. Additional method embodiments may further include: returning the feedback signal back into the error detection and correction module, whereby signal artifacts are removed from the feedback signal using a digital-to-analog converter (DAC).

In additional method embodiments, generating the correction signal further comprises: extracting an average of the DAC output signal using a low-pass filter; and generating an error signal by comparing an output of the low-pass filter to the analog input signal. In additional method embodiments, generating the PWM output signal further comprises: integrating the error signal with a low-pass filter to generate a triangle wave signal; and comparing the analog input signal with the triangle wave output from the low-pass filter, using a comparator to convert the analog input signal to a precision PWM output signal.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

The disclosed system and method in one embodiment provide a circuit configured to provide accurate electrical signal measurements while also being low in cost and easily manufacturable due to the components used to construct it. The disclosed system and method in one embodiment may utilize components that are not only inexpensive but are also components which may be sourced from multiple vendors making the design less sensitive to supply chain issues.

Pertaining to cost, an off-the-shelf chip that performs a similar function may include an AD7741 from analog devices and in current markets may cost ten times that of the present system. In terms of measurement accuracy, the present system provides an accuracy of +/−2%, while a similar system such as a 555 timer may perform closer to +/−20% accuracy due to the 555 timer not having any error correction.

In one embodiment, a system and method disclosed herein comprises a conversion circuit configured to convert an input signal such as a voltage signal to a pulse width modulation (PWM) signal that can be transferred across an isolation barrier where it can be either directly interfaced to a digital processor and sampled or converted back to an analog signal to be used for other purposes.

In one embodiment, a system and method disclosed herein also provides accurate high voltage measurements while also including built-in error correction. In one embodiment, the system and method, due to the built-in error correction, does not require high accuracy resistors, making the system and method maybe suitable for integration into a custom integrated circuit (IC). Furthermore, due to the present system's low transistor count, it can also be implemented on a small die area relative to other circuits that perform similar functions with different parts.

Figure 1:
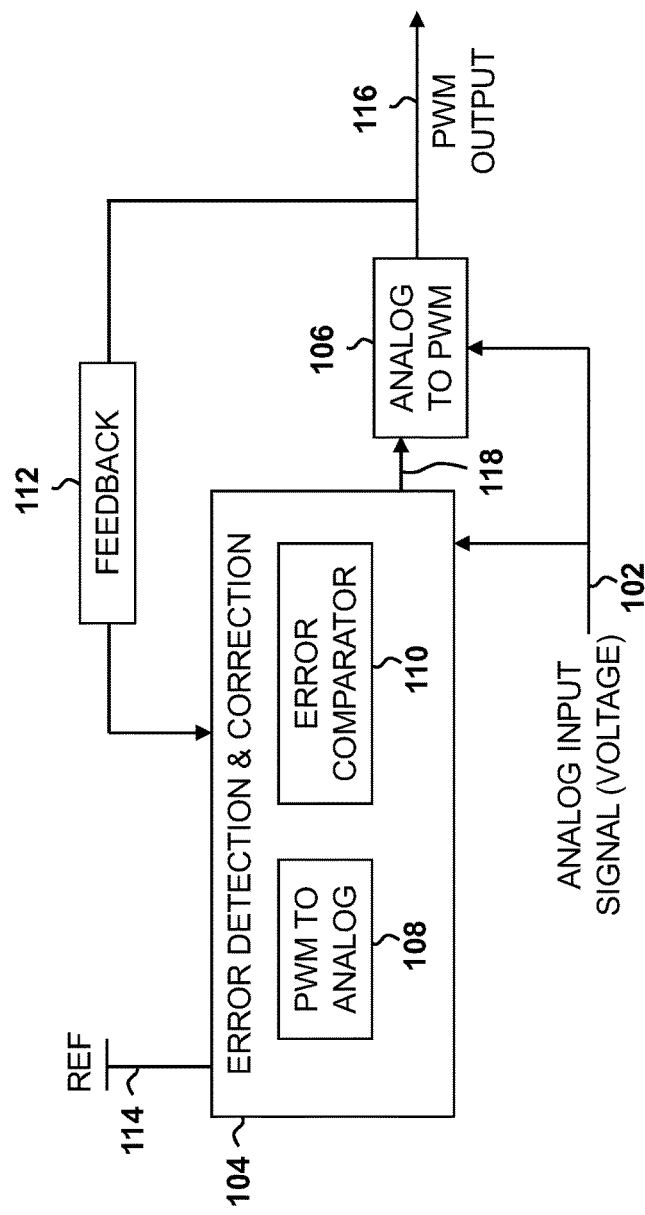
FIG. 1 depicts a high-level block diagram of a voltage conversion circuit, according to one embodiment.

FIG. 1 discloses a high-level block diagram of a conversion circuit 100, according to one embodiment disclosed herein. In one embodiment, the circuit 100 may be used in high-voltage application. The conversion circuit 100 is configured to receive an analog input signal 102. In some embodiments, the analog input signal 102 may comprise an electrical voltage signal. In other embodiments, the analog input signal 102 may comprise an electrical current signal. In one embodiment, the analog input signal 102 represents a signal to be measured. The circuit 100 further comprises an error detection and correction module 104, and analog to PWM module 106, and a feedback loop having a feedback signal 112.

The analog input signal 102 may be split into two inputs connected to the error detection and correction module 104 and the analog to PWM module 106. The error detection and correction module 104 may include a PWM to analog module 108 and an error comparator module 110.

The error detection and correction module 104 is configured to receive the analog input signal 102, a reference signal 114, and a feedback signal 112 and generate a correction signal 118. The analog to PWM module 106 is configured to receive the analog input signal 102 and the correction signal 118 and generate a PWM output signal 116. The generated PWM output signal 116 is fed back to the error detection and correction module 104 as said feedback signal 112. In one embodiment, the analog to PWM module 106 combines the correction signal 118 with the analog input signal 102, to generated corrected output signal 116.

The feedback signal 112 is utilized in creating a signal cleaning and processing iteration utilizing the error detection and correction module 104. The error detection and correction module 104, receives the analog input signal 102 and compares it to a referenced cleaner version of the feedback signal. Utilizing the feedback signal 112, the error detection and correction module 104 detects an error in the output signal 116 by using the error comparator module 110. By cleaning the feedback signal 112 first, the error detection portion provides a best representation of the output signal 116 while comparing it to a raw version of itself as input signal 102.

Figure 2:
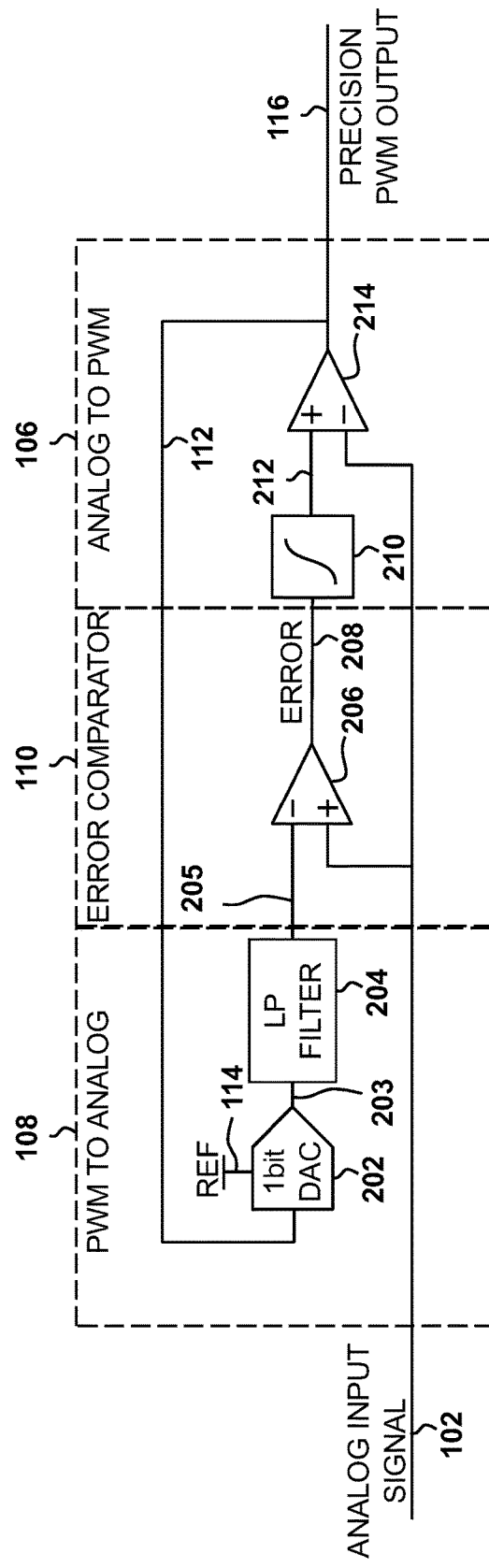
FIG. 2 depicts a detailed block diagram of the voltage conversion circuit of FIG. 1, according to one embodiment.

FIG. 2 depicts a block diagram of a conversion circuit 200 as an example implementation of the circuit 100 of FIG. 1, according to one embodiment. The circuit 200 receives an analog input signal 102 and generates a precision PWM output signal 116. The circuit 200 comprises a PWM to analog module 108, an error comparator module 110, and an analog to PWM module 106.

The PWM to analog module 108 is configured to receive a logic level PWM output signal 116 as a feedback signal 112 from the analog to PWM module 106 and convert the feedback signal 112 to an analog signal. The PWM to analog module 108 may include a digital-to-analog converter (DAC) such as a 1-bit DAC 202, which receives the feedback signal 112 and the reference signal 114 and converts the digital output signal 116 to an analog signal 203. The DAC 202 may be configured to convert the feedback signal 112 (i.e., PWM signal 116) to a controlled analog voltage range.

The reference signal 114 may comprise a constant reference voltage or current signal. In some embodiments, the precision signal reference 114 may be an externally supplied constant persistent DC reference voltage which may be slightly above an AC peak voltage of the analog input signal 102. In one embodiment, the output comparator 214 may include a built-in output buffer then that could function as the DAC 202. In this embodiment the DAC 202 would have been moved into comparator 214 and the reference signal 114 would supply comparator 214 directly.

When low-pass filtering a PWM signal, the resulting signal is a product of a duty cycle and the voltage of that PWM signal where the output is converted to a signal proportionate to the duty cycle of the square wave.

The PWM to analog module 108 further comprises a low-pass (LP) filter 204, where the analog output signal 203 from the DAC 202 is averaged by the low-pass filter 204 to generate an output signal 205. The output signal 205 from the low-pass filter 204 is proportionate to the duty cycle of the output signal 116.

The 1-bit DAC 202 may further be configured to remove artifacts found within a square wave returned as the feedback signal 112 from an output comparator 214, so that an accurate duty cycle can be measured. After artifacts have been removed, the 1-bit DAC 202 may be configured to reference the feedback signal 112 to a precision reference signal 114.

The error comparator module 110 comprise an error comparator 206 configured to receive and compare the output signal (or duty cycle) 205 from the low-pass filter 204, with the analog input signal 102. The error comparator 206 generates an error correction signal 208, such as a square error PWM signal, with a duty cycle that is proportional to the error of the feedback signal 112. In one example, said error is defined as the difference between a desired duty cycle and the actual duty cycle in the output signal 116, where a desired duty cycle is proportional to the input voltage. In some embodiments, the error PWM correction signal 208 comprises a binary signal. The correction signal 208 is similar to the correction signal 118 in FIG. 1.

Preferably, the analog output signal 205 of the PWM to analog module 108 may have an essentially identical amplitude as the amplitude of the analog input signal 102. The output signal 205 represents a duty cycle of the output signal 116 but does not in itself have a duty cycle. The voltage is proportional to the output duty cycle. The input signal 102 is analog and does not have a duty cycle.

Due to system induced errors, such as by circuit non-linearities including triangle wave inaccuracies, errors are introduced which require detection and error correction. An embodiment of the circuit 200 disclosed herein is configured to measure the triangle wave induced error and adjust the output signal 116 through an iterative process via feedback signal 112 comparing it to the measured error. In one embodiment, measuring the triangle wave induced error comprises utilizing the comparator 206 to determine the difference between the amplitude of the analog input signal 102 and the duty cycle of the output signal 205 of the PWM to analog module 108, and using the feedback loop comprising the feedback signal 112 for adjusting said output signal 116 through an iterative process comparing it to the measured duty cycle 205. Though the triangle wave non-linearity introduces a large portion of the error, other sources of errors also exist which are collectively identified as errors introduced by circuit non-linearities.

The analog to PWM module 106 comprises an integration unit such a low-pass filter 210, and an output comparator 214. The low-pass filter 210 receives and integrates the error correction output signal 208 from the error comparator module 110 and generates a triangle wave signal 212. The low-pass filter 210 converts a square wave input to a triangle wave signal. The output comparator 214 receives the triangle wave 212 signal and compares it to the analog input signal 102, to generate the feedback precision PWM output 116 with a duty cycle proportional to the analog input signal 102. The comparator 214 is involved in combining the error correction signal 208 with the analog input signal 102, to generate the corrected output signal 116.

In one embodiment, the error comparator 206 of the error comparator module 110 is configured to output a logic signal as the error correction signal 208 according to the measured duty cycle represented by the output signal 205 of the PWM to analog module 108, corresponding to whether the measured duty cycle is higher or lower than the analog input signal 102. For example, if the duty cycle of the output signal 205 of the PWM to analog module 108 is too high or higher than the analog input signal 102, the error comparator 206 may output a logic Low as the error correction signal 208. Alternatively, if the duty cycle represented by the output 205 of the PWM to analog module 108 is too low or lower than the duty cycle of the analog input signal 102, the error comparator 206 may output a logic High as the error correction signal 208.

In one example implementation, the circuit 200 operates on a signal duty cycle of about 75%, an analog input signal 102 of about 3.5V, a reference voltage signal 114 of about 5V, and an output signal voltage of about 3.75V. In this example, the duty cycle of the feedback signal 112 is about 75%. Using the feedback signal 112, the circuit 200 may determine the error and set the error correction signal 208 to low and maintain it there until the error has been essentially eliminated, thereby generating a more accurate precision PWM output 116 for utilizing the circuit 200 in signal measurements.

Figure 3:
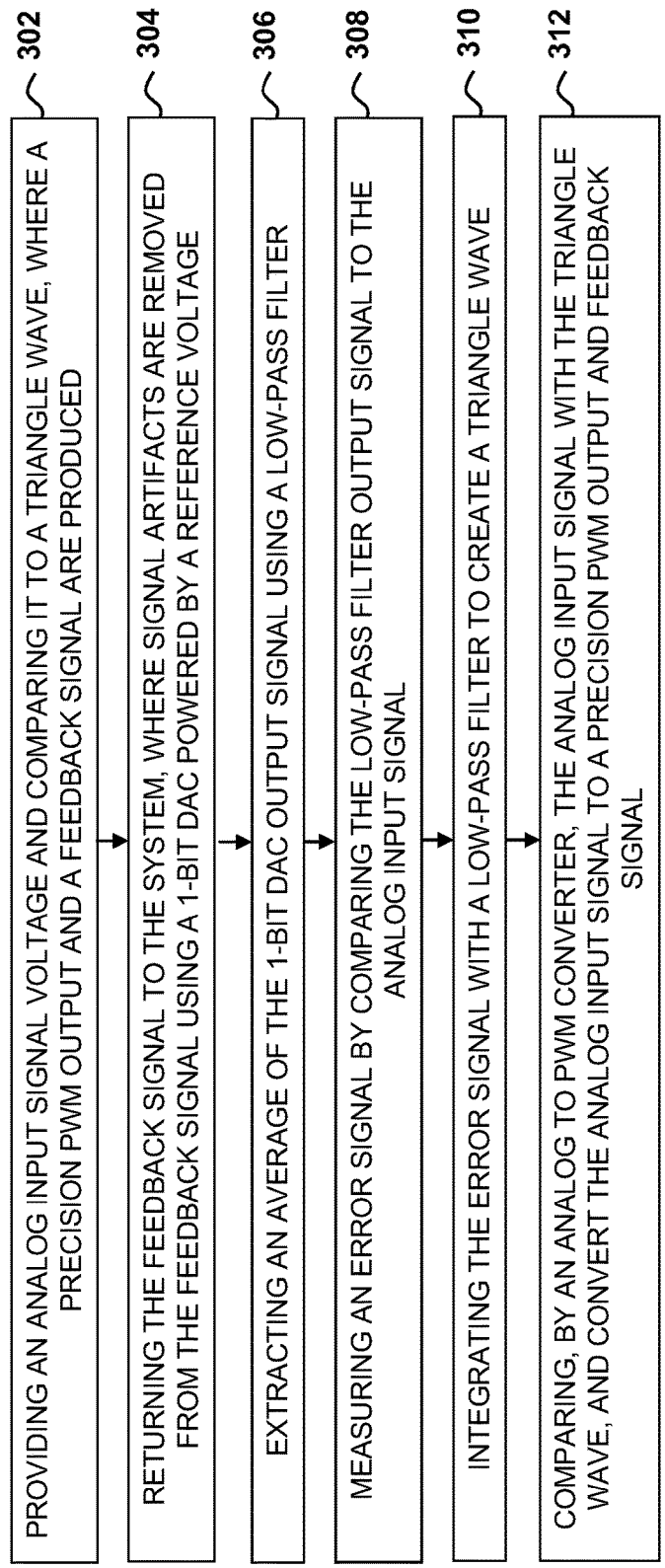
FIG. 3 depicts a method for converting an input voltage to a pulse width modulation (PWM) signal for measuring, according to one embodiment.

FIG. 3 depicts an iterative method 300 based on a feedback signal, implemented in circuit for converting an analog input signal such as a voltage signal to a PWM output signal, useful in measuring input signals such as voltage signals, according to one embodiment. The method 300 includes providing an analog input signal (102, FIG. 2) and comparing it to a triangle wave signal (212, FIG. 2), to generate a precision PWM output signal (116, FIG. 2) that is also fed back as a signal (112, FIG. 2) as outputs (step 302). The method 300 further includes returning the feedback signal (112, FIG. 2) back into the circuit, whereby signal artifacts are removed from the feedback signal (112, FIG. 2) using a 1-bit DAC (202, FIG. 2) that may be powered by a reference signal (114, FIG. 2) (step 304). The method 300 further includes extracting an average of the 1-bit DAC output signal (203, FIG. 2) using a low-pass filter (204, FIG. 2) (step 306). The method 300 further includes generating an error signal (208, FIG. 2) by comparing the output of the low-pass filter (204, FIG. 2) to the analog input signal (102, FIG. 2) (step 308). The method further includes integrating the error signal (208, FIG. 2) with a low-pass filter (210, FIG. 2) to generate a triangle wave signal (212, FIG. 2) (step 310). The method further includes comparing the analog input signal (102, FIG. 2) with the triangle wave signal (212, FIG. 2) output from the low-pass filter (210, FIG. 2), using a comparator (214, FIG. 2) to convert the analog input signal (102, FIG. 2) to a precision PWM output signal (116, FIG. 2) and a feedback signal (112, FIG. 2) (step 312).

Figure 4:
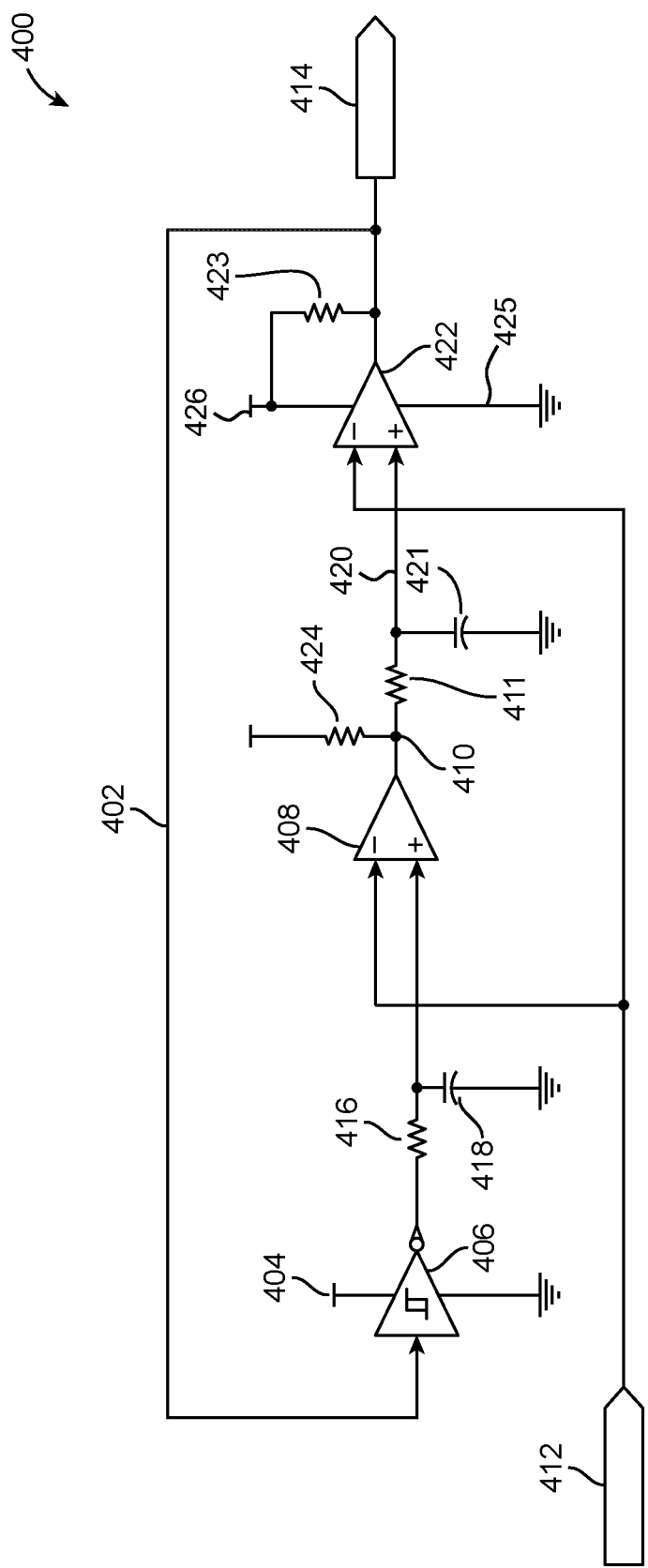
FIG. 4 depicts a second detailed block diagram of the high-voltage conversion circuit of FIG. 1, according to one embodiment.

FIG. 4 shows a schematic of a circuit 400 as an example implementation of the circuit 100 in FIG. 1, according to one embodiment. The circuit 400 receives an analog input 412 signal such as input voltage or input current and generates a PWM square wave output signal 414 which is fed back as a feedback signal 402. The feedback signal 402 is converted by a DAC 406 to an analog signal based on a reference signal 404, whereby the feedback signal 402 is cleaned of signal artifacts. In some embodiments, the reference signal 404 may be a DC voltage which is approximately the same amplitude as the maximum analog input signal 412. In other embodiments, the reference signal 404 may be slightly higher than the analog input signal 412. The reference signal may be the same or higher than the maximum input signal 412 amplitude. For example, if the input signal 412 ranges from about 0V to 2.5V then the reference signal 404 may be about 2.5V or slightly higher.

The circuit 400 may further include a first low-pass filter that averages the output of the DAC 406, which is the filtered feedback signal 402. The low-pass filter generates a signal proportional to the duty cycle of the analog input signal 412. The first low-pass filter comprises an RC circuit formed by a grounded capacitor 418 and a series resistor 416, connected as first RC circuit configuration between the output of the DAC 406 an input of a comparator 408.

The comparator 408 is configured to receive the output signal of the first low-pass filter and compare it with the analog input signal 412 to generate an error output signal 410. The circuit 400 may further include a second low-pass filter comprising a second RC circuit formed by the series resistor 411 and grounded capacitor 421. The second low-pass filter integrates the output error signal 410 to generate a triangle wave output signal 420. The capacitor 421 is connected to ground (or a voltage source) in parallel with the triangle wave output 420.

The circuit 400 further includes a comparator 422 which compares the analog input signal 412 with the triangle wave output signal 420, to generate a square wave PWM output signal 414 and the feedback signal 402. In some embodiments, the comparator 422 may be connected in parallel to a ground 425. In other embodiments a power source 426, and resistor 423 may be connected in parallel. In other embodiments, comparator 422 may use resistor 423 to drive an output signal of comparator 422 high. In other embodiments, a resistor 424 may be connected in parallel with error signal output 410, where the resistor 424 connects a power source to the circuit 400. In other embodiments, the comparator 408 may use resistor 424 to drive an output signal of the comparator 408 high. In one embodiment, the comparator 422 comprises an inverting comparator for which a reference voltage signal 420 is applied to the non-inverting terminal of the comparator 422 and the input voltage signal 412 is applied to inverting terminal of the comparator 422. The comparator 422 generates a PWM signal based on the input signals 420 and 412. In another embodiment, the comparator 422 may comprise an inverting comparator creating the square wave PWM out and feedback signals 414 and 402.

In one example implementation of the circuit 400, the resistor 416 may have a resistance of about 5 kiloohms and the capacitor 418 may have a capacitance of about 0.47 uF. In one example implementation, the resistor 411 may have a resistance of about 5 kiloohms, and the capacitor 421 may have a capacitance of 0.1 uF. In one example implementation, the resistor 423 may have a resistance of about 5 kiloohms, and the resistor 424 may have a resistance of about 5 kiloohms. Other circuit component values are possible within the spirit of the disclosed system and method herein, as those skilled in the art will recognize.

Figure 5:
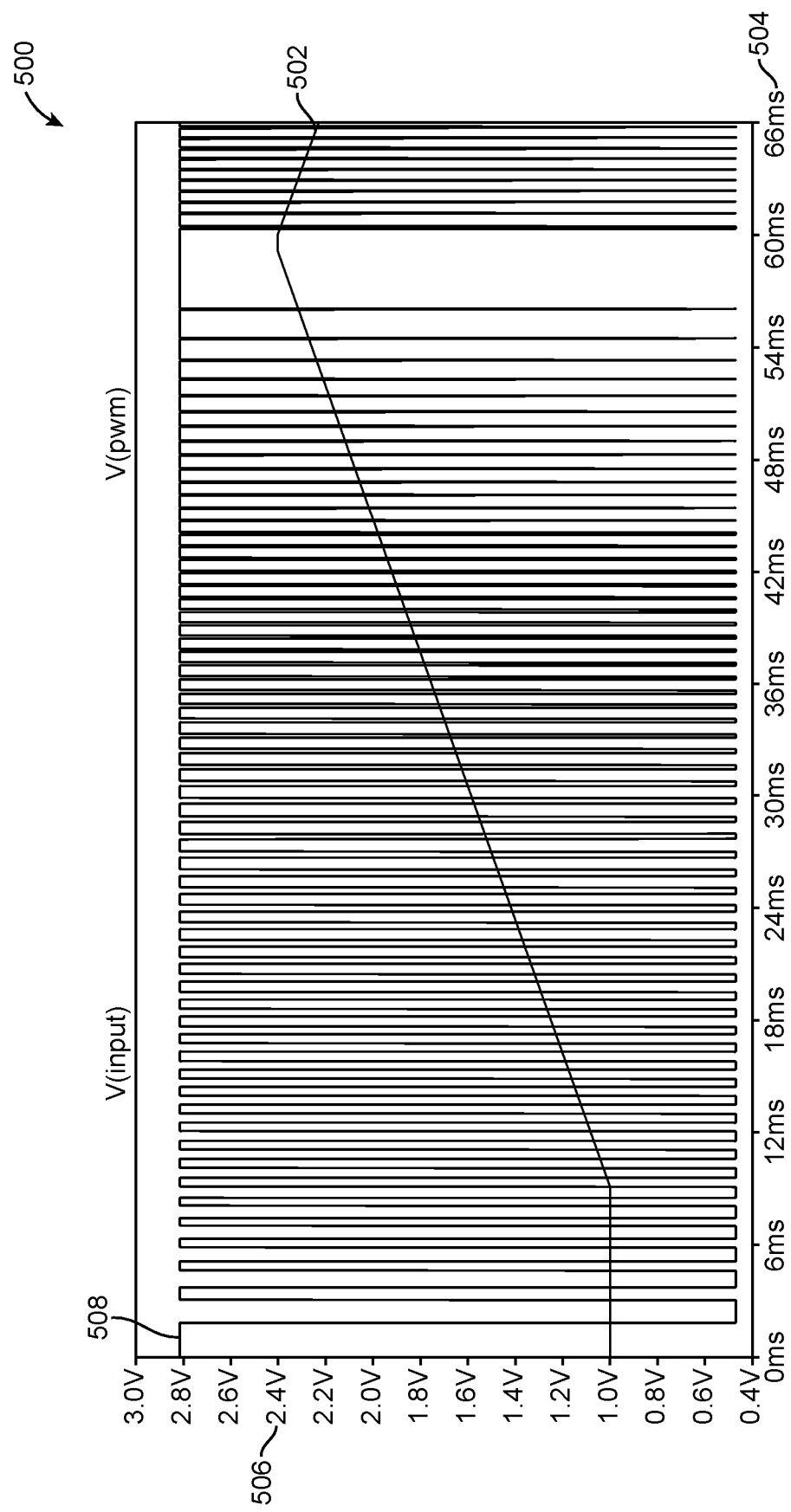
FIG. 5 depicts an input voltage ramping up and output pulse width modulation (PWM), according to one embodiment.

Referring to FIG. 5 in conjunction with FIG. 4, an example diagram 500 graphing input voltage signal (412, FIG. 4) as V(input) ramping up, and an output PWM signal (414, FIG. 4) as V(input), according to one embodiment disclosed herein. Measurement diagram 500 includes a graph where a horizontal X axis 504 is measured in units of milliseconds (ms) and a vertical Y axis 506 is measured in units of Volts (V, superimposed on PWM output signal of the comparator 422 in FIG. 4 shown as PWM output signal V(pmw) 508 in diagram 500, where the output PWM signal 508 has a duty cycle roughly proportional to the ratio of the input signal V(input) 412 over the reference voltage. Diagram 500 further illustrates that the PWM output signal V(pwm) 508 also changes to match the input triangle waveform 502. The waveform 502 represents the input voltage (412, FIG. 4), being varied linearly to illustrate how the output PWM changes in proportion in this example.

Figure 6:
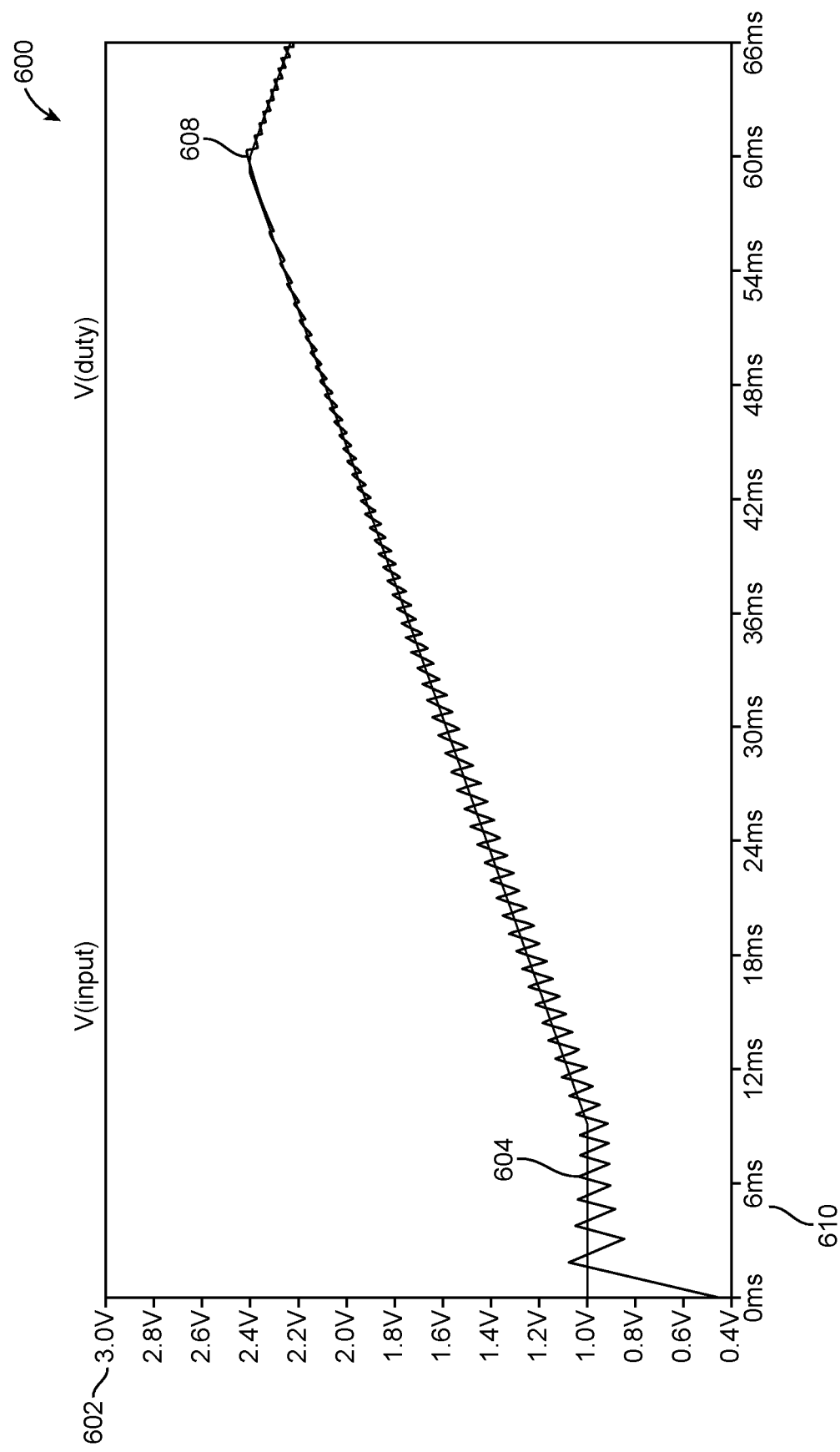
FIG. 6 depicts an input voltage and measured duty cycle, according to one embodiment.

FIG. 6 depicts another example diagram 600 depicting an input voltage signal V(input) 608 and measured duty cycle 604, according to one embodiment. The measured duty cycle includes a horizontal X axis 610 is measured in units of milliseconds (ms) and a vertical Y axis 602 is measured in units of Volts (V). Diagram 600 depicts a zoomed-in view of a duty cycle signal 604 output from resistor (416, FIG. 4), compared to an input voltage signal 608 V(input) The output comparator (422, FIG. 4) compares the input signal 608 and the triangle wave signal 604 to generate a square wave PWM output signal (414, FIG. 4) that is also fed back as a feedback signal (402, FIG. 4), wherein the PWM output signal (414, FIG. 4) is essentially proportional to the analog input signal 608.

Diagram 600 depicts an example input voltage and measured duty cycle measured prior to an output comparator (422, FIG. 4), where the duty cycle of the PWM output 414 is extracted. Diagram 600 further shows that when the duty cycle 604 deviates too far from the input voltage 608 the error comparator (206, FIG. 2) will change state to correct the error.

Figure 7A:
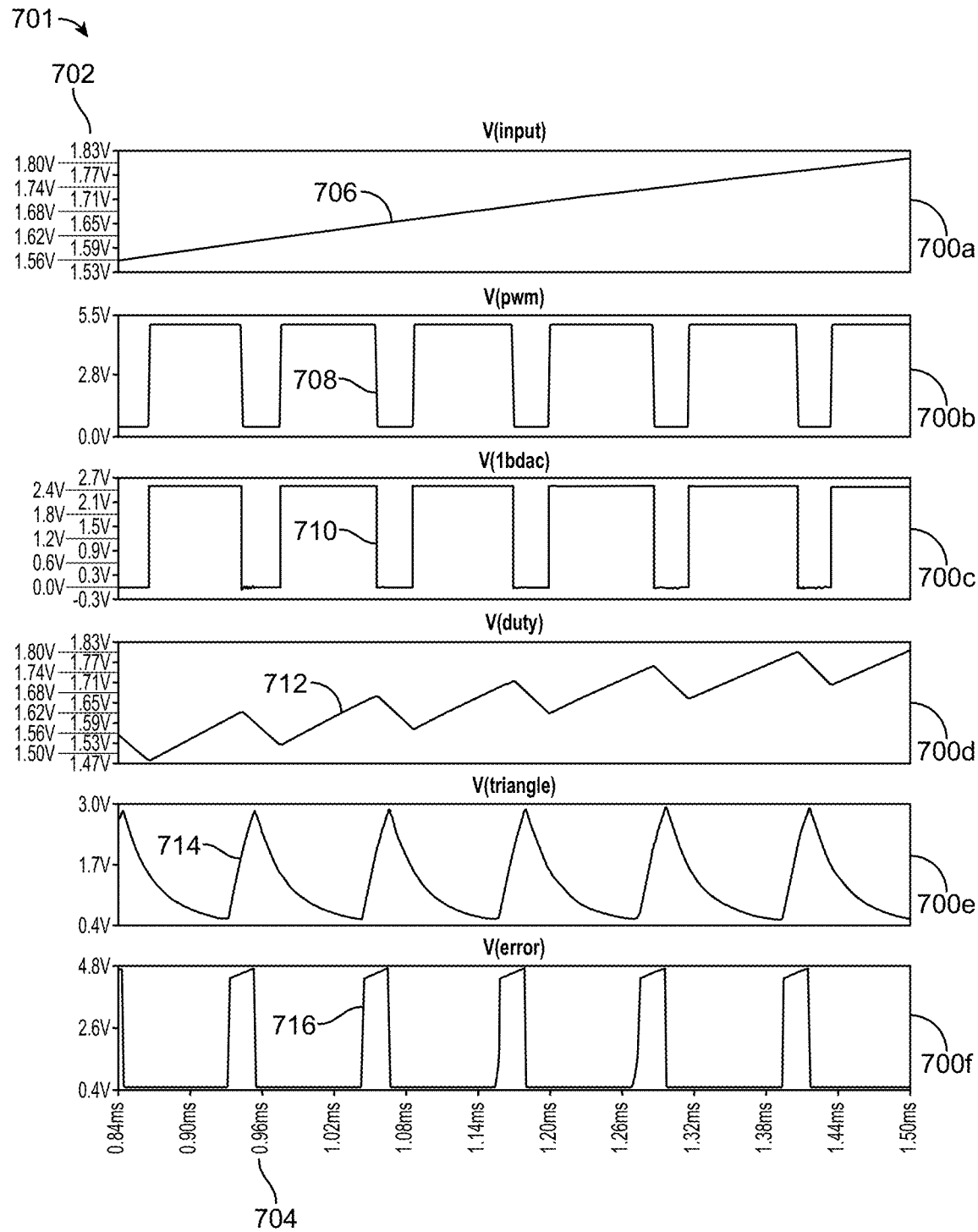
FIGS. 7A-7B depict measurements of all system signals, according to one embodiment.

FIG. 7A depicts an example measurement diagram 701 of all system signals in circuit (400, FIG. 4) charts 700*a-f*, according to one embodiment. Each chart 700*a-f* includes a vertical Y axis 702, where the Y axis 702 is measured in units of Volts (V), and a horizontal X axis 704, where the X axis 704 is measured in units of milliseconds (ms). Chart 700*a* depicts V(input) 706 which represents input signal (412, FIG. 4). Chart 700*b* depicts V(pwm) 708 which represents a measured output signal PWM OUT (414, FIG. 4) and feedback signal (402, FIG. 4). Chart 700*c* depicts V(1bdac) 710 which represents a measured output signal of 1-bit DAC (406, FIG. 4) measured before resistor (416, FIG. 4). Chart 700*d* depicts V(duty) 712 which represents a signal measured after resistor (416, FIG. 4). Chart 700*e* depicts V(triangle) 712 which represents a signal measured at (420, FIG. 4). Chart 700*f* depicts V(error) 716 which represents a signal measured after comparator (408, FIG. 4) and resistor (424, FIG. 4).

Figure 7B:
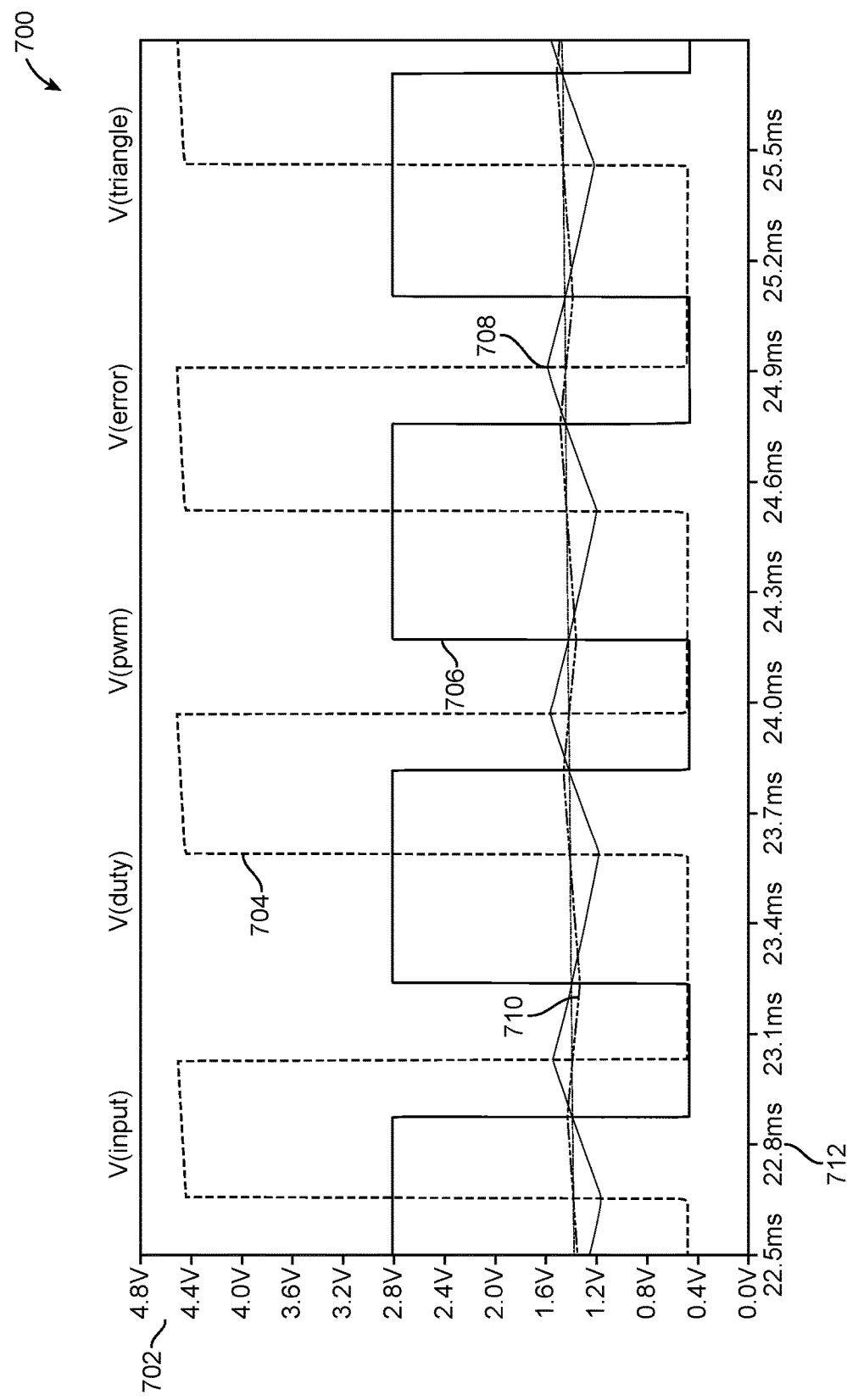

FIG. 7B depicts an example measurement diagram 700 of all system signals 700 in the circuit (400, FIG. 4), according to one embodiment. Included in system 700 is: a vertical Y axis, where the Y axis is measured in units of Volts (V), a horizontal X axis, where the X axis is measured in units of milliseconds (ms); V(error) 704 representing a signal measured after comparator (408, FIG. 4) and resistor (424, FIG. 4); V(pwm) 706 representing a measured output signal PWM OUT (414, FIG. 4) and feedback signal (402, FIG. 4); V(duty) 708 representing a signal measured after resistor (416, FIG. 4); V(triangle) 710 representing a signal measured at (420, FIG. 4); and V(input) 712 representing input signal (412, FIG. 4).

Embodiments of the disclosed system and method provide a circuit configured for performing accurate electrical signal measurements utilizing error correction as described herein. In one embodiment such a circuit may utilize low-cost components, which may also reduce of costs and complexity. Embodiments of the disclosed system and method may utilize components that are not only inexpensive but are also common components which can be sourced from multiple vendors making the design less sensitive to supply chain issues. Further, in one embodiment, in terms of measurement accuracy, a measurement circuit disclosed herein may provide an accuracy of about e.g., +/−2%, which is several times better in accuracy than existing solutions without error correction.

Figure 8:
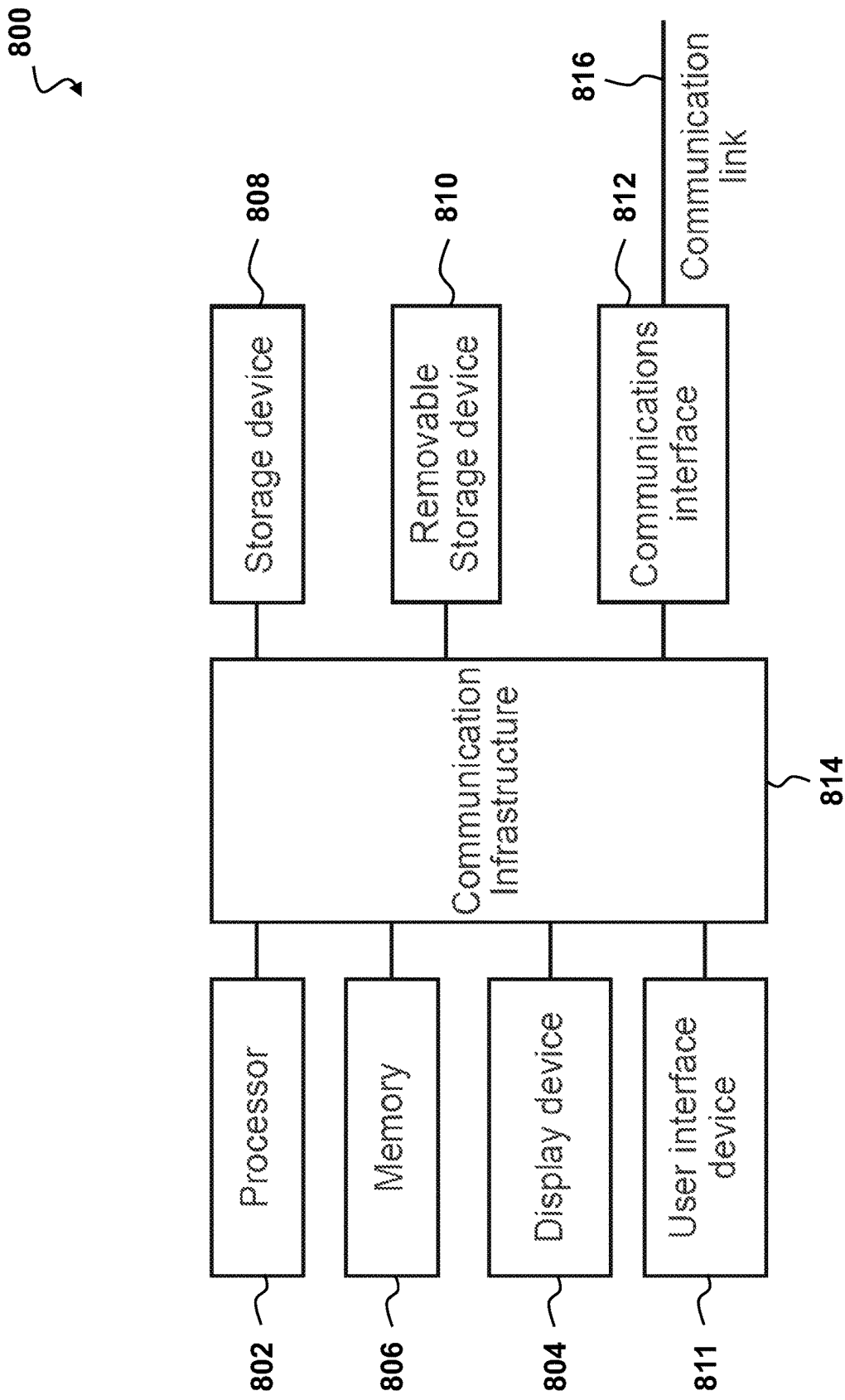
FIG. 8 shows a high-level block diagram and process of a computing system for implementing an embodiment of the system and process.

FIG. 8 is a high-level block diagram 800 showing a computing system comprising a computer system useful for implementing an embodiment of the system and process, disclosed herein. Embodiments of the system may be implemented in different computing environments. The computer system includes one or more processors 802, and can further include an electronic display device 804 (e.g., for displaying graphics, text, and other data), a main memory 806 (e.g., random access memory (RAM)), storage device 808, a removable storage device 810 (e.g., removable storage drive, a removable memory module, a magnetic tape drive, an optical disk drive, a computer readable medium having stored therein computer software and/or data), user interface device 811 (e.g., keyboard, touch screen, keypad, pointing device), and a communication interface 812 (e.g., modem, a network interface (such as an Ethernet card), a communications port, or a PCMCIA slot and card). The communication interface 812 allows software and data to be transferred between the computer system and external devices. The system further includes a communications infrastructure 814 (e.g., a communications bus, cross-over bar, or network) to which the aforementioned devices/modules are connected as shown. Information transferred via communications interface 814 may be in the form of signals such as electronic, electromagnetic, optical, or other signals capable of being received by communications interface 814, via a communication link 816 that carries signals and may be implemented using wire or cable, fiber optics, a phone line, a cellular/mobile phone link, an radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process.

Embodiments have been described with reference to flowchart illustrations and/or block diagrams of methods, apparatus (systems) and computer program products according to embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing embodiments. In alternative implementations, the functions noted in the blocks may occur out of the order noted in the figures, concurrently, etc. Computer programs (i.e., computer control logic) are stored in main memory and/or secondary memory. Computer programs may also be received via a communications interface 812. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system.

Figure 9:
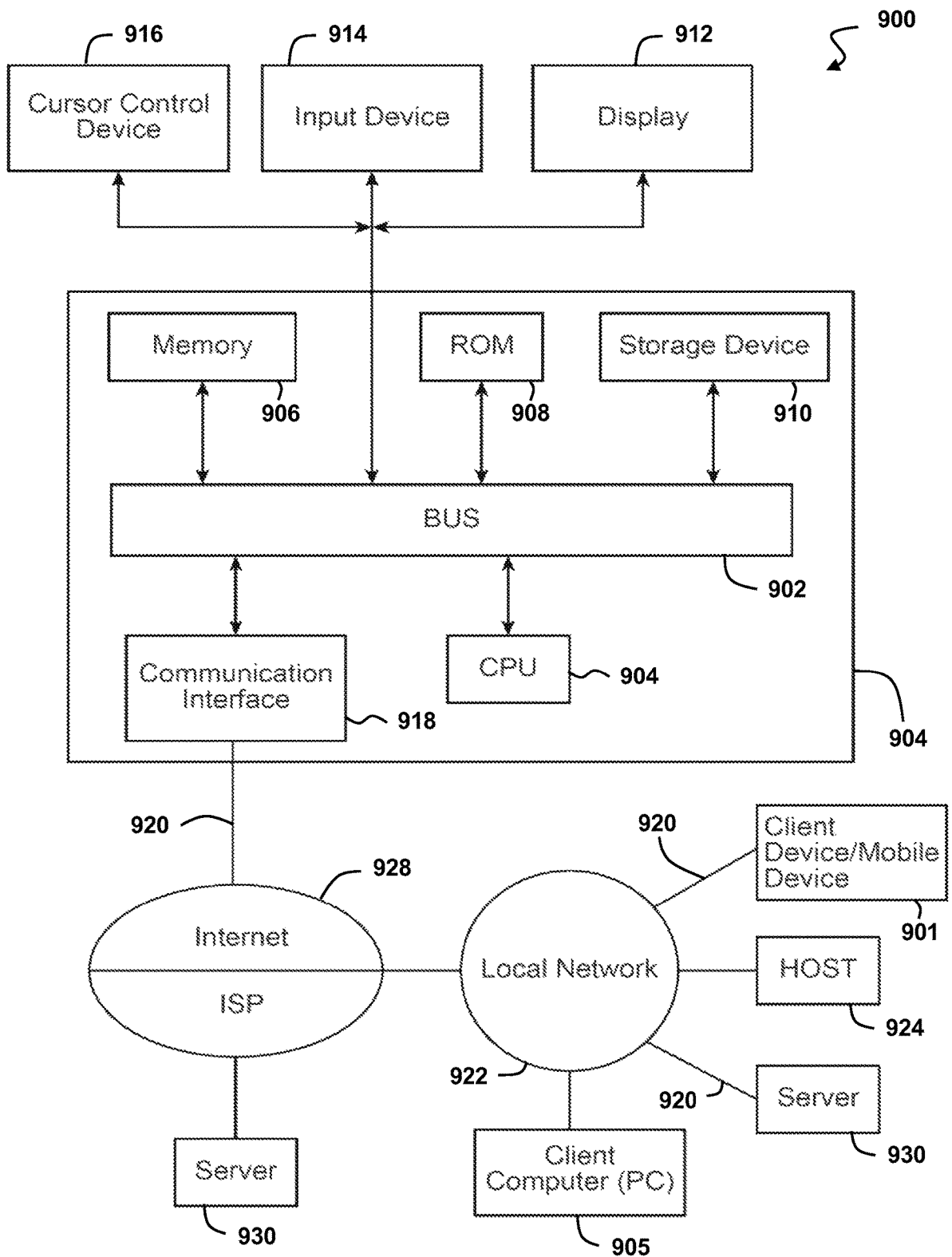
FIG. 9 shows a block diagram and process of an exemplary system in which an embodiment may be implemented.

FIG. 9 shows a block diagram of an example system 900 in which an embodiment may be implemented. The system 900 includes one or more client devices 901 such as consumer electronics devices, connected to one or more server computing systems 930. A server 930 includes a bus 902 or other communication mechanism for communicating information, and a processor (CPU) 904 coupled with the bus 902 for processing information. The server 930 also includes a main memory 906, such as a random access memory (RAM) or other dynamic storage device, coupled to the bus 902 for storing information and instructions to be executed by the processor 904. The main memory 906 also may be used for storing temporary variables or other intermediate information during execution or instructions to be executed by the processor 904. The server computer system 930 further includes a read only memory (ROM) 908 or other static storage device coupled to the bus 902 for storing static information and instructions for the processor 904. A storage device 910, such as a magnetic disk or optical disk, is provided and coupled to the bus 902 for storing information and instructions. The bus 902 may contain, for example, thirty-two address lines for addressing video memory or main memory 906. The bus 902 can also include, for example, a 32-bit data bus for transferring data between and among the components, such as the CPU 904, the main memory 906, video memory and the storage 910. Alternatively, multiplex data/address lines may be used instead of separate data and address lines.

The server 930 may be coupled via the bus 902 to a display 912 for displaying information to a computer user. An input device 914, including alphanumeric and other keys, is coupled to the bus 902 for communicating information and command selections to the processor 904. Another type or user input device comprises cursor control 916, such as a mouse, a trackball, or cursor direction keys for communicating direction information and command selections to the processor 904 and for controlling cursor movement on the display 912.

According to one embodiment, the functions are performed by the processor 904 executing one or more sequences of one or more instructions contained in the main memory 906. Such instructions may be read into the main memory 906 from another computer-readable medium, such as the storage device 910. Execution of the sequences of instructions contained in the main memory 906 causes the processor 904 to perform the process steps described herein. One or more processors in a multi-processing arrangement may also be employed to execute the sequences of instructions contained in the main memory 906. In alternative embodiments, hard-wired circuitry may be used in place of or in combination with software instructions to implement the embodiments. Thus, embodiments are not limited to any specific combination of hardware circuitry and software.

The terms "computer program medium," "computer usable medium," "computer readable medium", and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor multi-core processor to perform the features of the computer system. Accordingly, such computer programs represent controllers of the computer system.

Generally, the term "computer-readable medium" as used herein refers to any medium that participated in providing instructions to the processor 904 for execution. Such a medium may take many forms, including but not limited to, non-volatile media, volatile media, and transmission media. Non-volatile media includes, for example, optical or magnetic disks, such as the storage device 910. Volatile media includes dynamic memory, such as the main memory 906. Transmission media includes coaxial cables, copper wire and fiber optics, including the wires that comprise the bus 902. Transmission media can also take the form of acoustic or light waves, such as those generated during radio wave and infrared data communications. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

Various forms of computer readable media may be involved in carrying one or more sequences of one or more instructions to the processor 904 for execution. For example, the instructions may initially be carried on a magnetic disk of a remote computer. The remote computer can load the instructions into its dynamic memory and send the instructions over a telephone line using a modem. A modem local to the server 930 can receive the data on the telephone line and use an infrared transmitter to convert the data to an infrared signal. An infrared detector coupled to the bus 902 can receive the data carried in the infrared signal and place the data on the bus 902. The bus 902 carries the data to the main memory 906, from which the processor 904 retrieves and executes the instructions. The instructions received from the main memory 906 may optionally be stored on the storage device 910 either before or after execution by the processor 904.

The server 930 also includes a communication interface 918 coupled to the bus 902. The communication interface 918 provides a two-way data communication coupling to a network link 920 that is connected to the world wide packet data communication network now commonly referred to as the Internet 928. The Internet 928 uses electrical, electromagnetic or optical signals that carry digital data streams. The signals through the various networks and the signals on the network link 920 and through the communication interface 918, which carry the digital data to and from the server 930, are exemplary forms or carrier waves transporting the information.

In another embodiment of the server 930, interface 918 is connected to a network 922 via a communication link 920. For example, the communication interface 918 may be an integrated services digital network (ISDN) card or a modem to provide a data communication connection to a corresponding type of telephone line, which can comprise part of the network link 920. As another example, the communication interface 918 may be a local area network (LAN) card to provide a data communication connection to a compatible LAN. Wireless links may also be implemented. In any such implementation, the communication interface 918 sends and receives electrical electromagnetic or optical signals that carry digital data streams representing various types of information.

The network link 920 typically provides data communication through one or more networks to other data devices. For example, the network link 920 may provide a connection through the local network 922 to a host computer 924 or to data equipment operated by an Internet Service Provider (ISP). The ISP in turn provides data communication services through the Internet 928. The local network 922 and the Internet 928 both use electrical, electromagnetic or optical signals that carry digital data streams. The signals through the various networks and the signals on the network link 920 and through the communication interface 918, which carry the digital data to and from the server 930, are exemplary forms or carrier waves transporting the information.

The server 930 can send/receive messages and data, including e-mail, program code, through the network, the network link 920 and the communication interface 918. Further, the communication interface 918 can comprise a USB/Tuner and the network link 920 may be an antenna or cable for connecting the server 930 to a cable provider, satellite provider or other terrestrial transmission system for receiving messages, data and program code from another source.

The example versions of the embodiments described herein may be implemented as logical operations in a distributed processing system such as the system 900 including the servers 930. The logical operations of the embodiments may be implemented as a sequence of steps executing in the server 930, and as interconnected machine modules within the system 900. The implementation is a matter of choice and can depend on performance of the system 900 implementing the embodiments. As such, the logical operations constituting said example versions of the embodiments are referred to for e.g., as operations, steps or modules. Similar to a server 930 described above, a client device 901 can include a processor, memory, storage device, display, input device and communication interface (e.g., e-mail interface) for connecting the client device to the Internet 928, the ISP, or LAN 922, for communication with the servers 930.

The system 900 can further include computers (e.g., personal computers, computing nodes) 905 operating in the same manner as client devices 901, wherein a user can utilize one or more computers 905 to manage data in the server 930.

Figure 10:
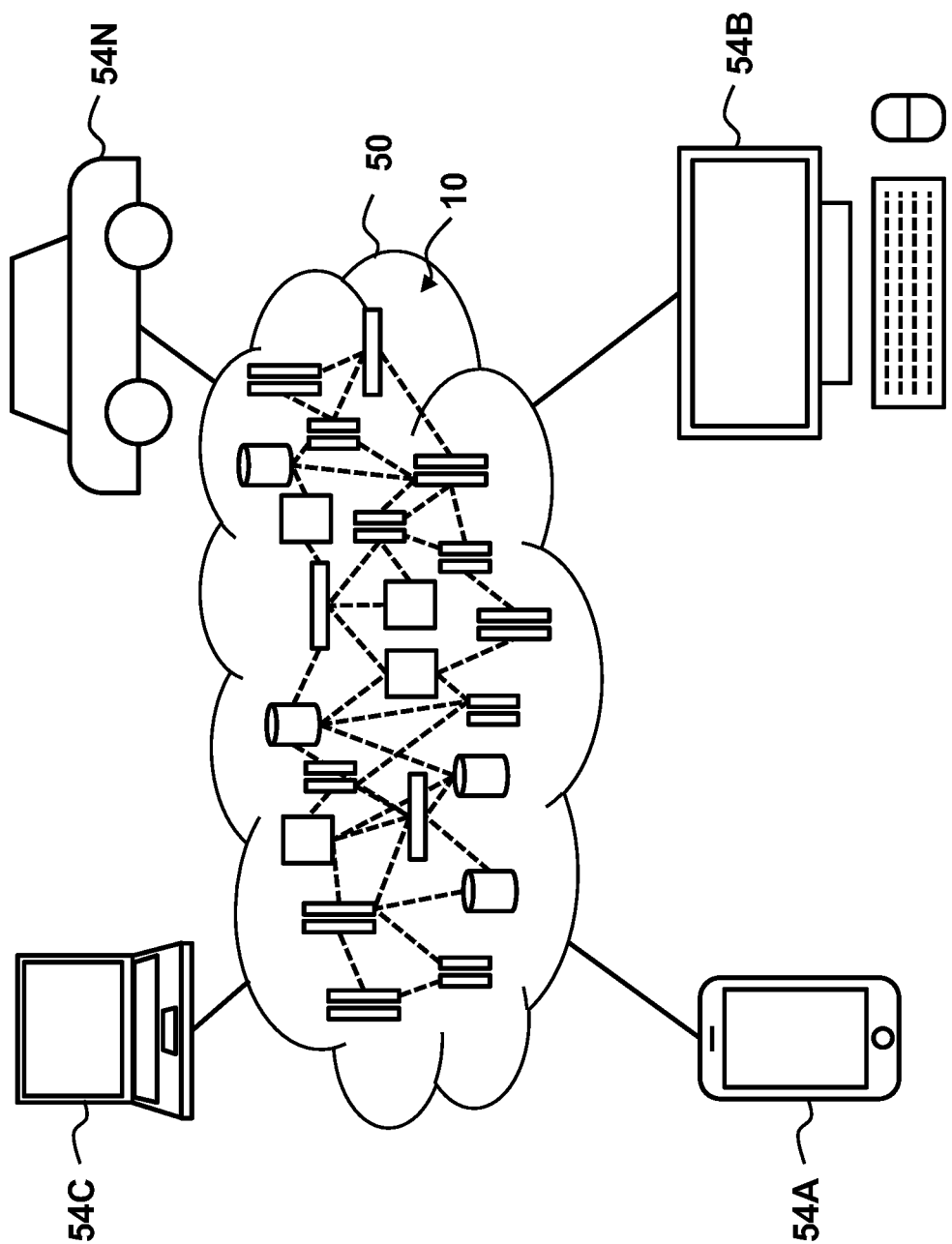
FIG. 10 depicts a cloud computing environment for implementing an embodiment of the system and process disclosed herein.

Referring now to FIG. 10, illustrative cloud computing environment 50 is depicted. As shown, cloud computing environment 50 comprises one or more cloud computing nodes 10 with which local computing devices used by cloud consumers, such as, for example, personal digital assistant (PDA), smartphone, smart watch, set-top box, video game system, tablet, mobile computing device, or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 10 are intended to be illustrative only and that computing nodes 10 and cloud computing environment 50 can communicate with any type of computerized device over any type of network and/or network addressable connection (e.g., using a web browser).

Additional circuits may be included for practical purposes, such as a slow turn-on, initial startup circuit, high voltage transient protection (which may clamp to the 28 Volts power supply 108), EMI filter circuits, and/or precision voltage references for increased accuracy.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention is herein disclosed by way of examples and should not be limited by the particular disclosed embodiments described above.

What is claimed is:

1. A system comprising:
an error detection and correction module (104) configured to receive an analog input signal (102) and a feedback signal (112) and generate a correction signal (118); and
an analog to pulse width modulation (PWM) module (106) configured to receive the analog input signal (102) and the correction signal (118) and generate a PWM output signal (116);
wherein the generated PWM output signal (116) is fed back to the error detection and correction module (104) as said feedback signal (112).

2. The system of claim 1, wherein the error detection and correction module (104) comprises a PWM to analog module (108).

3. The system of claim 2, wherein the PWM to analog module (108) is configured to receive the feedback signal (112) and the analog input signal (102) and generate an analog signal.

4. The system of claim 3, wherein the error detection and correction module (104) further comprises an error comparator module (110).

5. The system of claim 4, wherein the error comparator module (110) is configured to receive and compare the analog signal from the PWM to analog module (108) with the analog input signal (102) to generate an error correction signal (208) proportional to the feedback signal (112).

6. The system of claim 1, wherein the analog to PWM module (106) comprises a low-pass filter (210).

7. The system of claim 6, wherein the low-pass filter (210) receives and integrates the correction signal (118) and generates a triangle wave signal (212).

8. The system of claim 7, wherein the analog to PWM module (106) further comprises an output comparator (214).

9. The system of claim 8, wherein the output comparator (214) receives and compares the triangle wave signal (212) to the analog input signal (102) and generates the PWM output signal (116), wherein the PWM output signal (116) comprises a duty cycle proportional to the analog input signal (102).

10. The system of claim 2, wherein the PWM to analog module (108) further comprises a digital-to-analog converter (DAC) (202).

11. The system of claim 10, wherein the DAC (202) receives the feedback signal (112) and a reference signal (114) and converts feedback signal (112) to an analog output signal (203).

12. The system of claim 11, wherein the PWM to analog module (108) further comprises a low-pass (LP) filter (204).

13. The system of claim 12, wherein the LP filter (204) receives the analog output signal (203) and generates an output signal (205), wherein the output signal (205) from the LP filter (204) is proportionate to a duty cycle of the analog input signal (102).

14. The system of claim 13, wherein the error detection and correction module (104) further comprises an error comparator module (110), and wherein the error comparator module (110) further comprises an error comparator (206).

15. The system of claim 14, wherein the error comparator (206) receives and compares the output signal (205) from the LP filter (204) to the analog input signal (102) and generates an error correction signal (208), wherein the error correction signal (208) has a duty cycle that is proportional to that of the feedback signal (112).

16. A method comprising:
receiving an analog input signal (102) at an error detection and correction module (104) and an analog to pulse width modulation (PWM) module (106);
receiving a feedback signal (112) at the error detection and correction module (104);
generating a correction signal (118) at the error detection and correction module (104) based on the received analog input signal (102) and the received feedback signal (112);
receiving the correction signal (118) at the analog to PWM module (106);
generating a PWM output signal (116) at the analog to PWM module (106) based on the received correction signal (118), wherein the generated PWM output signal (116) is fed back to the error detection and correction module (104) as said feedback signal (112).

17. The method of claim 16, wherein generating the PWM output signal (116) further comprises:
comparing the analog input signal (102) to a triangle wave signal (212).

18. The method of claim 16, further comprising:
returning the feedback signal (112) back into the error detection and correction module (104), whereby signal artifacts are removed from the feedback signal (112) using a digital-to-analog converter (DAC) (202).

19. The method of claim 18, wherein generating the correction signal (118) further comprises:
extracting an average of the DAC output signal (203) using a low-pass filter (204); and
generating an error signal (208) by comparing an output of the low-pass filter (204) to the analog input signal (102).

20. The method of claim 19, wherein generating the PWM output signal (116) further comprises:
integrating the error signal (208) with a low-pass filter (210) to generate a triangle wave signal (212); and
comparing the analog input signal (102) with the triangle wave (212) output from the low-pass filter (210), using a comparator (214) to convert the analog input signal (102) to a precision PWM output signal (116).

* * * * *